United States Patent
Arnborg (10) Patent No.: US 7,652,519 B2
(45) Date of Patent: Jan. 26, 2010

(54) APPARATUS AND METHOD FOR EXPLOITING REVERSE SHORT CHANNEL EFFECTS IN TRANSISTOR DEVICES

(75) Inventor: Torkel Arnborg, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 202 days.

(21) Appl. No.: 11/449,460

(22) Filed: Jun. 8, 2006

(65) Prior Publication Data

US 2007/0287404 A1 Dec. 13, 2007

(51) Int. Cl.
*H03K 17/687* (2006.01)
*H04B 1/28* (2006.01)

(52) U.S. Cl. .................. 327/427; 327/562; 327/359; 455/333

(58) Field of Classification Search .................. 327/427, 327/562, 359; 330/264, 269; 455/326

See application file for complete search history.

(56) References Cited

U.S. PATENT DOCUMENTS

| 5,747,854 | A | 5/1998 | Gotou |
| 6,169,314 | B1 | 1/2001 | Wong et al. |
| 6,285,227 | B1 | 9/2001 | Takahashi et al. |
| 7,441,211 | B1* | 10/2008 | Gupta et al. .................. 716/2 |
| 2001/0030574 | A1 | 10/2001 | Takai |
| 2002/0047140 | A1 | 4/2002 | Moller et al. |
| 2003/0129958 | A1* | 7/2003 | Behzad .................. 455/326 |
| 2005/0164671 | A1* | 7/2005 | Darabi .................. 455/333 |

FOREIGN PATENT DOCUMENTS

| JP | 58220505 | 12/1983 |
| JP | 2000244264 | 9/2000 |
| WO | WO 02/13235 A2 | 2/2002 |

OTHER PUBLICATIONS

Subramanian, C. et al., "Reverse Short Channel Effect and Channel Length Dependence of Boron Penetration in PMOSFETs", 1995, IEEE, IEDM 95, pp. 423-426.*
Sedra and Smith, "Microelectronic Circuits", 2004, Oxford University Press, Fifth Edition, pp. 292.*
Subramanian et al., "Reverse Short Channel Effect and Channel Length Dependence of Boron Penetration in PMOSFETs", 1995, IEEE, pp. 17.3.1-17.3.4.*
Odanaka, Shinji and Hiroki, Akira., "Potential Design and Transport Property of 0/1-μm MOSFET with Asymmetric Channel Profile." IEEE Transactions On Electron Devices. Apr. 1997. pp. 595-600. vol. 44. No. 4.

(Continued)

*Primary Examiner*—Lincoln Donovan
*Assistant Examiner*—Colleen O'Toole
(74) *Attorney, Agent, or Firm*—Coats & Bennett, P.L.L.C.

(57) ABSTRACT

A method of implementing a transistor circuit comprises coupling first and second transistors in parallel, wherein the first transistor has a channel length corresponding to a peak in the transistor's voltage threshold curve arising from reverse short channel effects, and the second transistor has a longer channel length and, therefore, a lower threshold voltage. Exploiting reverse short channel effects in this manner enables the implementation of "composite" transistor circuits that exhibit improved linearity.

20 Claims, 7 Drawing Sheets

OTHER PUBLICATIONS

Sano, Eiichi and Tsukahara, Tsuneo and Iwata, Atsushi., "Performance Limits of Mixed Analog/Digital Circuits with Scaled MOSFET's." IEEE Journal Of Solid-State Circuits. Aug. 1988. pp. 942-949. vol. 23. No. 4.

Sirisantana, Naran and Roy, Kaushik, "Low-Power Design Using Multiple Channel Lengths and Oxide Thickness." IEEE Design & Test of Computers. Jan.-Feb. 2004. pp. 56-63. Copublished by the IEEE CS and the IEEE CASS.

Schmoock, James C., "An Input Stage Transconductance Reduction Technique for High-Slew Rate Operational Amplifiers." IEEE Journal of Solid-State Circuits. Dec. 1975. pp. 407-411. vol. SC-10. No. 6.

Kim, Bonkee et. al., "A New Linearization Techniques for MOSFET RF Amplifier Using Multiple Gated Transistors." IEEE Microwave And Guided Wave Letters. Sep. 2000. pp. 371-373. vol. 10. No. 9.

Van Der Heijden, Mark P. et. al., "Theory and Design of an Ultra-Linear Square-Law Approximated LDMOS Power Amplifier in Class-AB Operation." IEEE Transactions On Microwave Theory And Techniques. Sep. 2002. pp. 2176-2184. vol. 50. No. 9.

Dennard, R.H., et. al., "Ion Implanted MOSFETs With Very Short Channel Lengths." IEEE Journal of Solid State Ckt. pp. 152-155. Oct. 1974.

Wong, Man et. al. "Reverse Short-Channel Effect in Metal-Induced Laterally Crystallized Polysilicon Thin-Film Transistors." IEEE Electron Device Letters. Nov. 1999. pp. 566-568. vol. 20. No. 9.

* cited by examiner

APPARATUS AND METHOD FOR EXPLOITING REVERSE SHORT CHANNEL EFFECTS IN TRANSISTOR DEVICES

TECHNICAL FIELD

The present invention generally relates to transistor devices, and particularly relates to exploiting reverse short channel effects in such devices.

BACKGROUND

Linear signal amplification represents a core enabling function in most communication circuits. For example, wireless communication transceivers employ linear signal amplification at various stages in their transmit and receive signal processing paths. More particularly, radiofrequency (RF) based communication systems rely on linear amplification in frequency mixing circuits, low-noise amplification circuits, power amplification circuits, and the like, to maintain signal fidelity and to limit the generation of unwanted harmonic frequencies. However, the non-linear current-voltage (IV) behavior of semiconductor transistors, such as bipolar or MOS transistors, represents a fundamental source of signal non-linearity in communication circuits, which rely heavily on the use of such transistors.

Important transistor-related parameters for most analog RF building blocks include transconductance, noise, and output conductance. In particular, transistor transconductance, which is the derivative of the drain/collector current with respect to the gate-source/base-emitter voltage, represents a fundamental measure of transistor linearity. As the transconductance depends directly on the transistor threshold voltage, i.e., the "turn-on" voltage, non-linearity in transistor threshold voltage results in signal amplification non-linearity.

Various circuit techniques offer compensation for transistor device non-linearity. For example, negative feedback loops provide compensation, at the expense of reduced bandwidth and increased circuit complexity. "Pre-distortion" techniques offer another compensation mechanism, wherein offsetting distortion applied to the signal of interest tends to cancel the expected non-linearity distortions arising from transistor device non-linearity. Of course, pre-distortion increases circuit complexity, and depends on accurate characterization of non-linear distortion.

More fundamental non-linearity compensation mechanisms exist apart from or in conjunction with the above compensation techniques. For example, a more linear composite transistor device can be formed by placing two or more transistors with different threshold voltages in parallel. Of course, making the composite transistor device exhibit better linearity depends on selecting the appropriate voltage threshold values for the parallel devices, both in the absolute and relative senses.

Various techniques exist for causing different ones of the parallel transistor elements to have different thresholds. For example, different biasing levels for different ones of the paralleled transistors results in different threshold voltages. More fundamentally, different transistor sizes and/or different dopant concentrations and distribution profiles for different ones of the paralleled transistors results in different threshold voltages. In some respects, the use of different transistor sizes to obtain different threshold voltages represents a preferred approach, particularly in integrated circuit applications.

As one example, the same basic transistor layout in a given process technology may be scaled to two different geometries, resulting in differently sized parallel transistors having different threshold voltages because of their different dimensions. More particularly, for a given process technology, transistor threshold voltage varies as a function of transistor channel length. Thus, paralleling transistors of different (diffusion) channel lengths represents one approach to achieving a composite transistor device with improved linearity.

Complexities arise in the context of shrinking channel lengths. For example, transistor threshold voltage tends to decrease gradually with decreasing transistor channel lengths, but begins falling off rapidly below a certain minimum channel length. The rapid threshold voltage fall off is one of several transistor behavioral changes that often are referred to as "short channel effects." With the relatively steep slope of the threshold voltage function at or below the minimum channel length, the threshold voltage of a transistor having less than the minimum channel length exhibits significant sensitivity to channel length variations inherent in the manufacturing process.

So-called "reverse short channel effects" (RSCE) further complicate the use of short-channel transistors. In the context of transistor threshold voltage, RSCE manifests itself as a reversal in the fall-off of threshold voltage with decreasing channel length. More particularly, in certain transistor process technologies, such as deep submicron MOS transistors implemented at 0.1 micron channel lengths or less, the threshold voltage increases as channel length reduces toward the minimum channel length, but then begins decreasing at or around the minimum channel length. This RSCE behavior thus results in a peak (maximum) threshold at or around the minimum channel length, with a normally steep roll-off to zero leftward of the peak, and a falling transition into the conventional asymptotic trend line rightward of the peak.

With the above complications in mind, conventional approaches to implementing short-channel transistor circuits, including linearized parallel transistor elements, maintain channel lengths above the minimum, thereby avoiding pronounced short channel and reverse short-channel effects. Another known alternative short-channel transistor design approach relies on fabrication techniques that minimize or at least reduce short channel and reverse short channel effects. For example, because short-channel phenomenon in part arise from the pronounced influence of dopant distribution defects in deep sub-micron channels, certain dopant distribution techniques can be used to compensate short-channel effects.

SUMMARY

In one embodiment, a transistor circuit comprises parallel first and second transistors having substantially the same threshold voltage curve as a function of transistor channel length. The first transistor is configured with a first transistor channel length matched to a threshold voltage peak in the threshold voltage curve arising from reverse short channel effects, and the second transistor is configured with a second transistor channel length greater than the first channel length. This configuration results in the second transistor having a threshold voltage lower than a threshold voltage of the first transistor, thereby improving a linearity of the transistor circuit over a given range of operating conditions.

A corresponding method of implementing a transistor circuit comprises coupling in parallel first and second transistors having substantially the same threshold voltage curve as a function of transistor channel length. This method includes configuring the first transistor to have a first transistor channel length matched to a threshold voltage peak in the threshold voltage curve arising from reverse short channel effects, and configuring the second transistor to have a second transistor channel length greater than the first channel length. With this configuration, the threshold voltage of the second transistor is lower than a threshold voltage of the first transistor, thereby improving a linearity of the transistor circuit over a given range of operating conditions.

As non-limiting examples, a transistor circuit implemented as taught herein offers the advantage of improved linearity without need for added linearization circuit elements, such as resistors, which can add cost, increase circuit size, and worsen noise performance. Further, because improved linearity as taught herein inures from exploitation of reverse short channel effects in paralleled transistor elements, such implementation does not increase biasing circuit complexity, nor does it complicate the fabrication process. Moreover, such implementation offers relatively low sensitivity to process variations, particularly where the transistor fabrication process yields transistors that exhibit relatively broad threshold voltage peaking at or around the minimum channel length Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
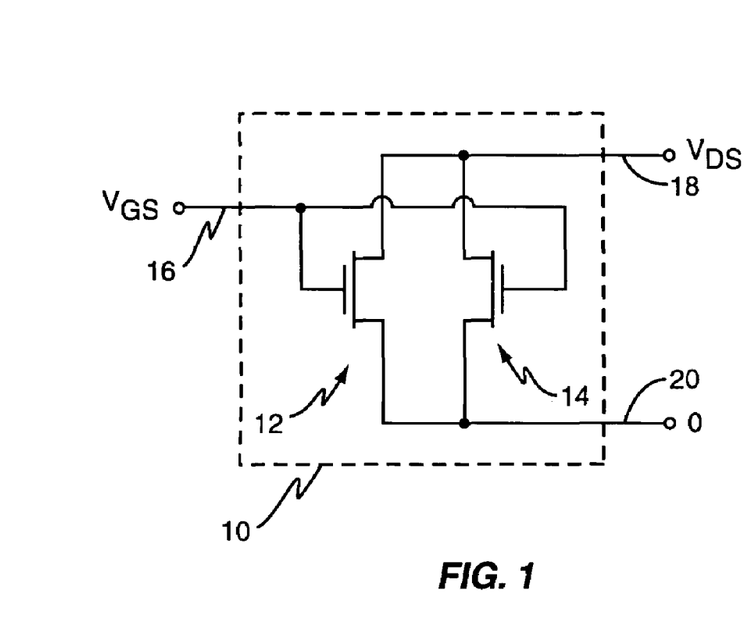
FIG. 1 is a block diagram of one embodiment of a transistor circuit.

FIG. 1 illustrates a "composite" transistor circuit 10, formed by coupling a first transistor 12 in parallel with a second transistor 14, such that the two transistors 12 and 14 share a gate connection 16, a drain connection 18, and a source connection 20. (For bipolar implementations of the transistor circuit 10, these connections correspond to base, collector, and emitter connections, respectively.) Note that the transistor circuit 10 is, in one or more embodiments, implemented in an integrated circuit process, wherein the first transistor 12 comprises two or more integrated circuit transistor elements configured with the first transistor channel length, and the second transistor 14 comprises two or more integrated circuit transistor elements configured with the second transistor channel length.

In one or more embodiments, the first and second transistors 12 and 14 have substantially the same threshold voltage curve as a function of transistor channel length, but are configured with different channel lengths such that the two transistors 12 and 14 exhibit different threshold voltages. More particularly, the first transistor 12 is configured with a first transistor channel length matched to a threshold voltage peak in the threshold voltage curve arising from reverse short channel effects, and the second transistor 14 is configured with a second transistor channel length greater than the first channel length.

With the above configuration, the threshold voltage of the second transistor 14 is lower than a threshold voltage of the first transistor 12. As will be explained later herein, exploiting the reverse short channel effects to obtain different threshold voltages for the parallel first and second transistors 12 and 14 results in a transistor circuit 10 with improved linearity as compared to the linearity of transistors 12 and 14 taken individually. Further, the exploitation of reverse short channel effects as taught herein results in good threshold voltage insensitivity to channel length variations associated with manufacturing tolerances.

Figure 2:
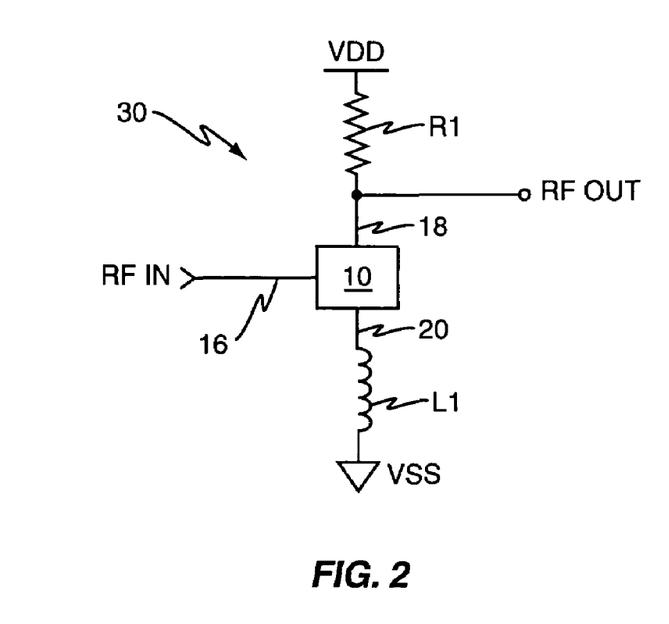
FIG. 2 is a block diagram of one embodiment of a low-noise amplifier circuit.

The improved linearity and good manufacturability of the transistor circuit 10 make it an ideal building block in a wide range of circuit applications, including a wide range of radiofrequency communication circuits. By way of non-limiting example, FIG. 2 illustrates a radiofrequency low-noise amplifier circuit 30 comprising an embodiment of the transistor circuit 10. In operation, a radiofrequency (RF) input signal (RF IN) drives the gate connection 16, while the drain connection 18 couples to a supply voltage rail (VDD) through a drain load resistor R1, and thereby provides a radiofrequency output signal, RF OUT. Finally, the source connection 20 couples to a reference voltage, e.g., VSS, through an emitter degeneration inductor L1, which provides impedance matching for the RF IN driving circuit.

Figure 3:
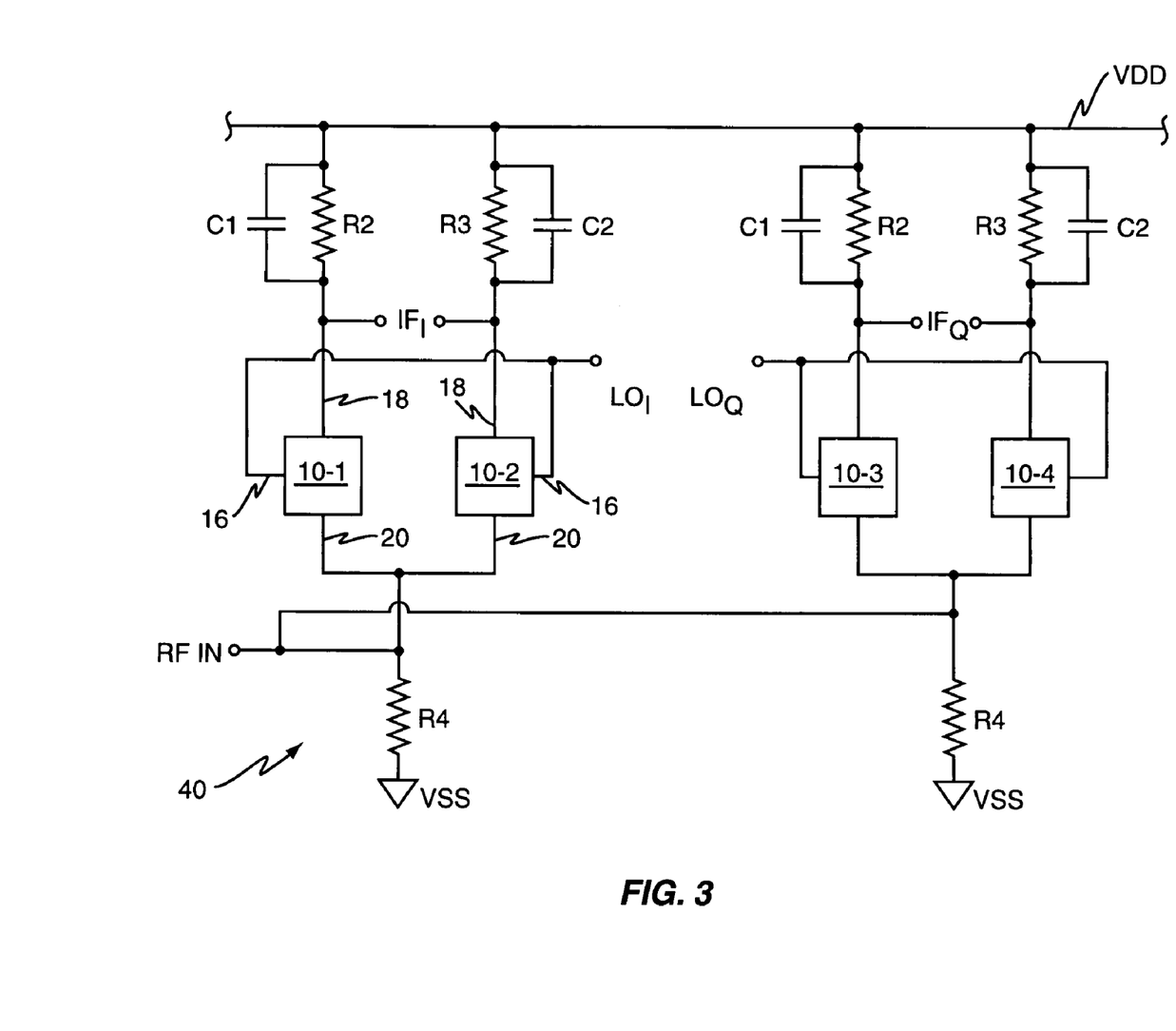
FIG. 3 is a block diagram of one embodiment of a mixer circuit.

As another non-limiting example, FIG. 3 illustrates an RF mixer circuit 40 comprising an embodiment of the transistor circuit 10. The illustrated mixer circuit 40 is configured as a quadrature mixer, wherein pairs of mixer core transistors 10-1/10-2 and 10-3/10-4 couple to a VDD supply rail through parallel RC circuits (R2 and C1 elements). The mixer circuit 40 provides intermediate frequency quadrature outputs $IF_I$ and $IF_Q$ responsive to local oscillator input signals $LO_I$ and $LO_Q$ and the RF input signal (RF IN), which is applied to the source resistors R4 coupling the source connections 20 of each mixer core transistor pair to ground or VSS.

Of course, the transistor circuit 10 has applicability in a wide range of circuits and devices. For example, the transistor circuit 10 can be included within a radiofrequency power amplifier. However, these and other examples given herein are not limiting.

Figure 4:
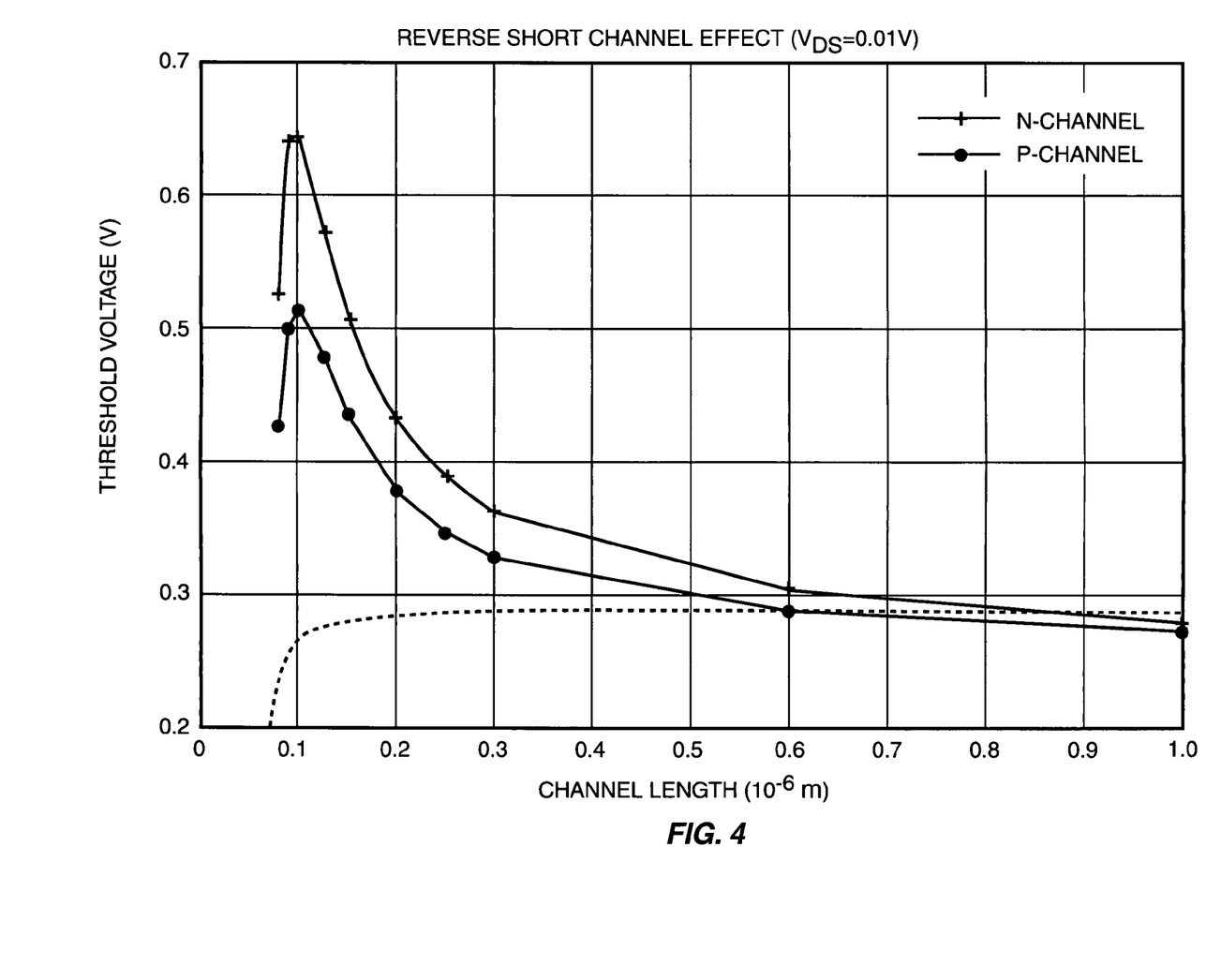
FIG. 4 is a graph of example transistor threshold voltage curves.

Returning to details of the transistor circuit 10, the dashed-line curve in FIG. 4 illustrates a "nominal" threshold voltage curve for an example semiconductor process having a "minimum" channel length of about 0.1 µm, where the term "minimum" channel length is defined as the channel length below which short channel effects become significant. At about 0.1 µm, the nominal threshold voltage curve begins falling off rapidly, while it asymptotically approaches a maximum value as channel length increases above about 0.1 µm. Given the steepness of the nominal threshold voltage curve below about 0.1 µm, one might reasonably guess that any transistor implemented in the illustrated process with a sub-minimum channel length would exhibit high threshold voltage sensitivity to manufacturing variations in channel length.

With this point in mind, the solid-line curves in FIG. 4 represent actual threshold voltage curves for N-channel and P-channel embodiments of the first and second transistors 12 and 14, as implemented in a given semiconductor process. More particularly, these curves illustrate examples of reverse short channel effects, wherein at or about 0.6 μm, the threshold voltage begins rising with decreasing transistor channel lengths, eventually peaking at or about 0.1 μm, and then falling off rapidly below 0.1 μm. The transistor circuit 10 as taught herein exploits this type of reverse short channel effect to obtain different but stable threshold voltages for the first and second transistors 12 and 14.

For example, one embodiment of an implementation method set in the context of the N- or P-channel curves of FIG. 4, comprises configuring the first transistor circuit 12 to have a first transistor channel length matched to the threshold voltage peak in the threshold voltage curve arising from reverse short channel effects, e.g., at or about 0.1 μm. With that selection for the first transistor 12, the implementation method further comprises configuring the second transistor 14 to have a second transistor channel length greater than the first transistor channel length, e.g., greater than 0.1 μm.

In at least one embodiment, the second transistor channel length is configured to be at least about twice the first transistor channel length, and preferably configured to be at least three times the first transistor channel length. In another embodiment, with the first transistor channel length at about 0.1 μm, the second transistor channel length is configured to be greater than 0.1 μm, and preferably to be in the range of 0.3 μm to 0.6 μm. Of course, all of these values represent examples set in the specific context of the illustrated curves, and those skilled in the art will appreciate that all such examples are non-limiting, and will change with changing semiconductor process characteristics.

Figure 5:
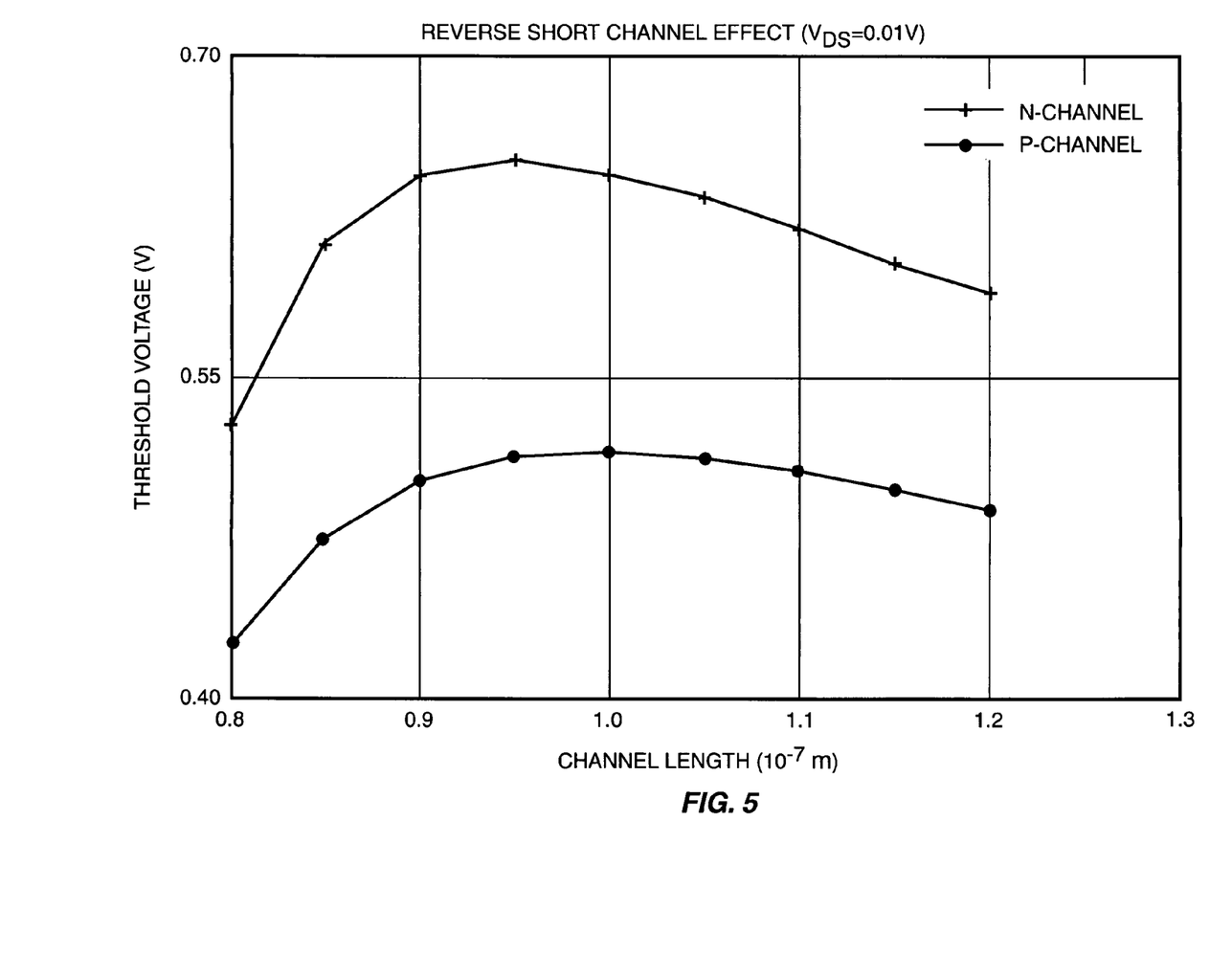
FIG. 5 is a graph of relatively flat threshold voltage peaks arising from reverse short channel effects for one embodiment of N-channel and P-channel transistors.

In any case, fixing the channel length of the first transistor 12 at the threshold voltage peak while fixing the channel length of the second transistor at some greater value provides a convenient and repeatable mechanism for obtaining appreciable separation between the threshold voltages of the two transistors 12 and 14. Furthermore, the stability of this configuration, i.e., the manufacturing process insensitivity, of this configuration can be improved by tailoring the semiconductor process to exhibit a relatively broad threshold voltage peak. With a broad peak, slight variations in the transistor channel length arising from process fabrication tolerances will not cause significant deviations in the threshold voltage of the first transistor 12, whose channel length is targeted to be at or about the length corresponding to the nominal threshold voltage peak. FIG. 5 illustrates a magnified view of the threshold voltage peaks for the N- and P-channel device curves given in FIG. 4, and exhibit the desired broad peak behavior.

Figure 6:
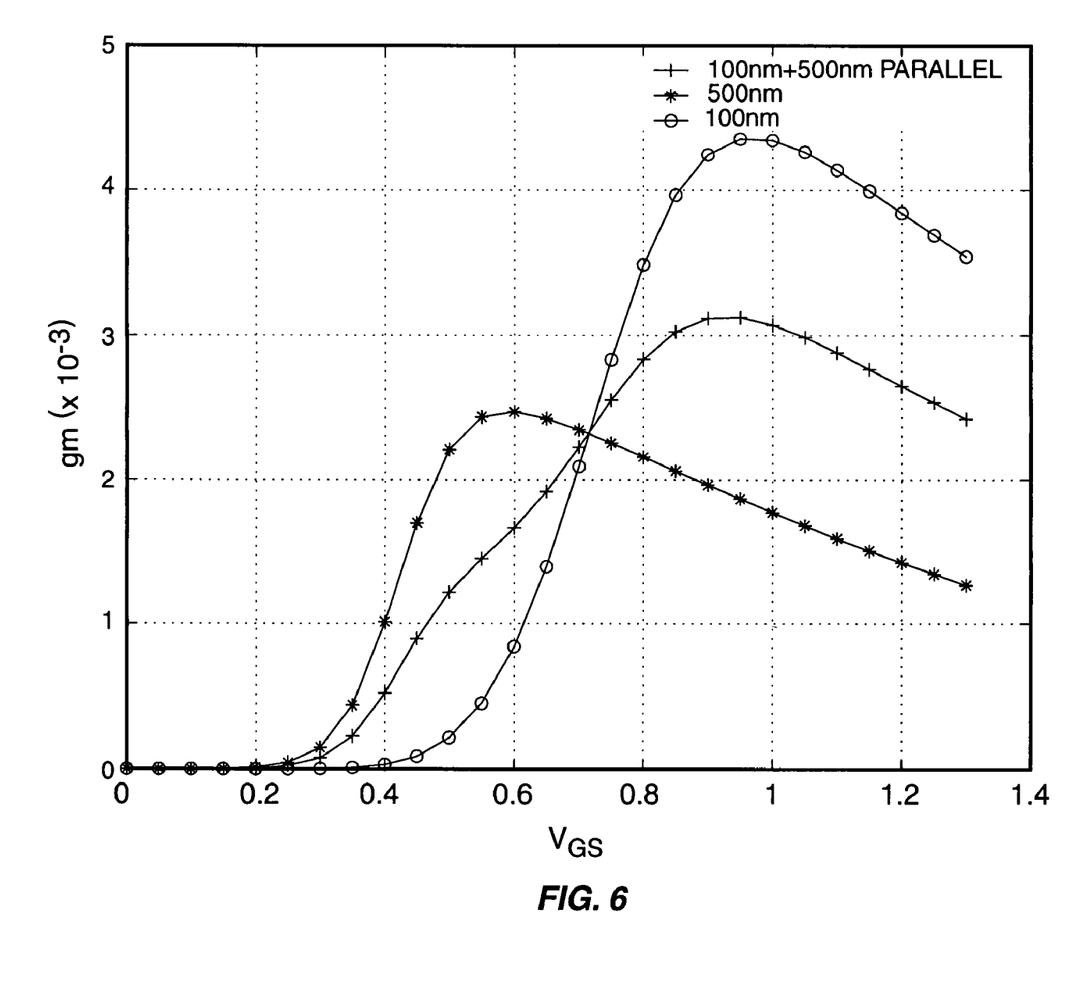
FIG. 6 is a graph of example individual transistor and composite transistor transconductance curves.
Figure 7:
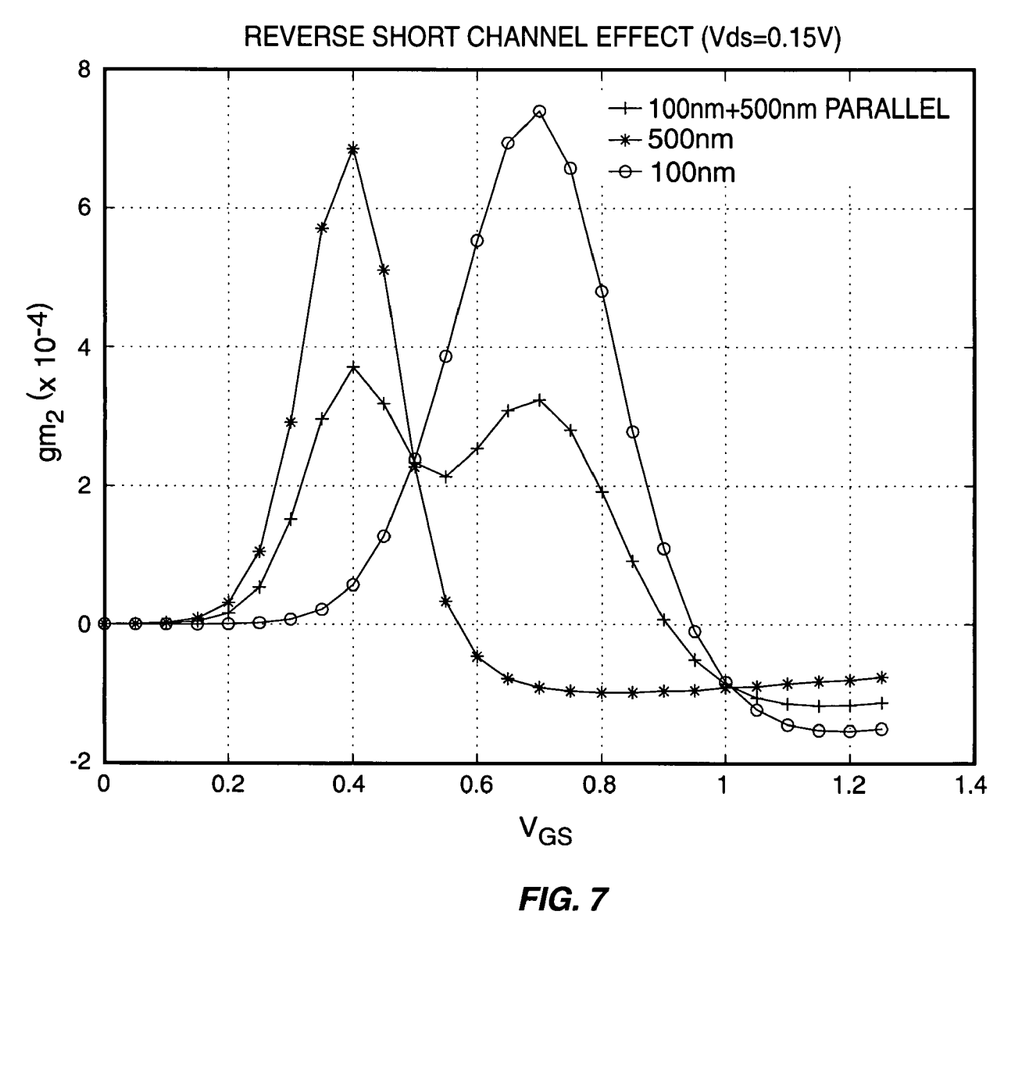
FIG. 7 is a graph of individual and composite transistor transconductance derivative curves.

FIGS. 6 and 7 provide further behavioral illustrations. In particular, these two figures illustrate example improvements in linearity gained by the transistor circuit 10 through exploitation of the reverse channel effects. More particularly, FIG. 6 illustrates transconductance curves ($g_m$) for example embodiments of the individual transistors 12 and 14 (0.1 micron and 0.5 micron channel lengths, respectively), and for the parallel-coupled combination of the transistors 12 and 14, as would be implemented in a corresponding embodiment of the transistor circuit 10.

Transconductance, noise, and output conductance represent at least some of the important parameters to consider regarding use of the transistor circuit 10 as a building block in RF circuits. The drain-source current may be expressed as $$I_{DS} = \frac{\mu C_{ox} W}{2L}(V_{gs} - V_t)^2 \qquad \text{Eq. (1)}$$

where $C_{ox}$ is the capacitance (per unit area) of the oxide layer separating the gate from the channel, W is channel width, L is channel length, $V_{gs}$ is the gate-source voltage, and $V_t$ is the threshold voltage. As previously noted, transconductance represents the derivative of the drain-source current with respect to the gate-source voltage. Thus, with the expression in Eq. (1) for $I_{DS}$, the transconductance may be expressed as $$g_m = \frac{\mu C_{ox} W}{L}(V_{gs} - V_t) \qquad \text{Eq. (2)}$$

Also, according to a first order approximation for CMOS transistors, flicker noise is given as $$S_f = \frac{K g_m^2}{WLC_{ox}^2} \qquad \text{Eq. (3)}$$

where K is a constant determined by the semiconductor process technology involved.

With the above, one sees that transconductance is a measure of transistor linearity, and that, at least to a first approximation, higher linearity is achieved by making transconductance vary less with applied gate bias. On that point, one sees that the transconductance curve of the composite transistor circuit 10 is decidedly more linear than either of the individual transconductance curves. Likewise, FIG. 7 illustrates individual and combined curves representing the derivative of the transconductances illustrated in FIG. 6. Again, one sees the decidedly improved linearity of the combined curve.

Understanding the improved linearity of the transistor circuit 10, as illustrated in FIGS. 6 and 7 for example, may be better understood based on modeling the transistors 12 and 14 according to the same polynomial function, but with potentially different coefficients to account for any geometry differences between the two transistors 12 and 14. For MOS transistors, the polynomial coefficients are proportional to channel width, W, and, generally, dependent on channel length, L, in a non-linear fashion., Thus, for the general case where the paralleled transistors 12 and 14 have different channel lengths and widths, and different threshold voltages, $V_t$, the drain-to-source transistor currents for the first and second transistors 12 and 14, respectively, are $$I_{ds1} = a_1 + b_1(V_{gs} - V_{t1}) + c_1(V_{gs} - V_{t1})^2 + d_1(V_{gs} - V_{t1})^3 \qquad \text{Eq. (4)}$$

and $$I_{ds2} = a_2 + b_2(V_{gs} - V_{t2}) + c_2(V_{gs} - V_{t2})^2 + d_2(V_{gs} - V_{t2})^3 \qquad \text{Eq. (5)}$$

With the above individual transistor currents, the combined current of the paralleled pair of transistors 12 and 14 is given as $$I_{ds} = I_{ds1} + I_{ds2} \qquad \text{Eq. (6)}$$

In terms of distortion analysis, one can express the current in powers of gate voltage as $$I_{ds1} = a_1 + a_2 - b_1 V_{t1} - b_2 V_{t2} + c_1 V_{t1}^2 + \\ c_2 V_{t2}^2 (b_1 + b_2 - 2c_1 V_{t1} - 2c_2 V_{t2} + 3d_1 V_{t1}^2 + 3d_2 V_{t2}^2) V_{gs} + \qquad \text{Eq. (7)}$$

-continued $$(c_1 + c_2 - 3d_1 V_{t1} - 3d_2 V_{t2})V_{gs}^2 + (d_1 + d_2)V_{gs}^3$$

The quadratic term in Eq. (7) is of particular interest, because it determines the second order intercept point (IP2). With that understanding, in at least one embodiment of the transistor circuit 10, the threshold voltages of the transistors 12 and 14 are configured so that $C_1+c_2-3d_1V_{t1}-3d_2V_{t2}=0$, which cancels the quadratic term from Eq. (7). Note that in practice the quadratic term may not completely cancel because of process tolerance variations, but any substantial reduction in this and other higher order terms is beneficial.

For example, as discussed earlier herein in the context of FIG. 6, configuring the transistors 12 and 14 with different threshold voltages can be used to minimize transconductance variation over a range of gate bias voltages. One approach to such minimization considers the derivative of the transconductance—see FIG. 7—which is denoted as $g_{m2}$. With respect to Eq. (7), one may neglect terms above the third order, such that the $g_{m2}$ term will match the coefficient for the 2nd order term in the equation.

With the above configuration details in mind, the transistor circuit 10 generally is configured with first and second transistor channel lengths such that a difference in threshold voltages between the first transistor 12 and the second transistor 14 reduces non-linearity in the transistor circuit's transconductance. In this context, the difference in threshold voltages of the first and second transistors 12 and 14 is operative to balance on-state current contributions of the first and second transistors.

Figure 8:
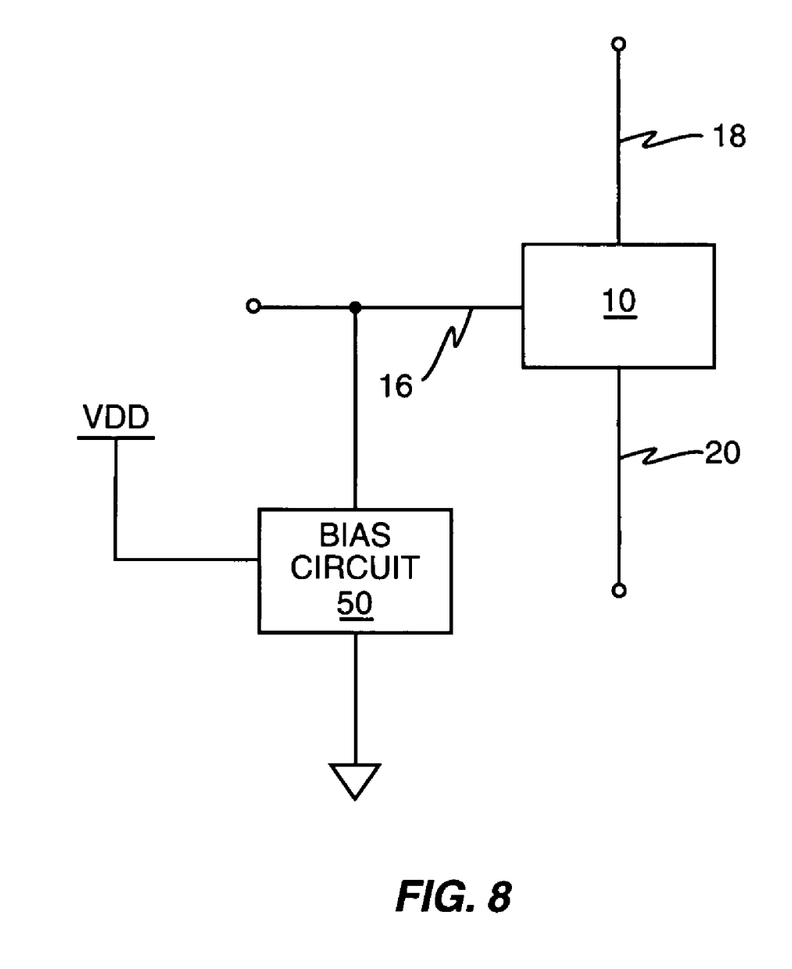
FIG. 8 is a block diagram of one embodiment of a transistor biasing circuit.

Further, according to the teaching herein, biasing of the transistor circuit 10 is used to set essentially the same transconductance and flicker noise values for the first and second transistors 12 and 14. The gate bias value to be applied to the gate input 16 of the transistor circuit 10 that results in the transistors 12 and 14 having the same operational transconductance and flicker noise behavior can be calculated as a function of the first and second transistor channel lengths ($L_1$, $L_2$) and the threshold voltages ($V_{t1}$, $V_{t2}$) of the first and second transistors 12 and 14. FIG. 8 illustrates one embodiment of a biasing circuit 50, which may be used to provide a correctly calculated bias for the transistor circuit 10.

Calculating an advantageous bias value for the transistor circuit 10 depends on understanding the geometric transistor scaling relationship that underlies the improved linearity performance of the transistor circuit 10. In traditional Very-Large-Scale-Integrated (VLSI) circuit design, transistor length and width are reduced by a factor s<1, so that $$W_1 \Rightarrow sW_2 \quad \text{Eq. (8)}$$

and $$L_1 \Rightarrow sL_2 \quad \text{Eq. (9)}$$

However, for use of the transistor circuit 10 as an RF building block, it is advantageous to use a scaling method that conserves transconductance, flicker noise, and, possibly, output conductance, so that scaling the geometry of the shorter transistor 12 down from that of the longer transistor 14 is given as $$W_1 = \frac{W_2}{s} \quad \text{Eq. (10)}$$

and $$L_1 = sL_2 \quad \text{Eq. (11)}$$

such that $$V_{gs} - V_{t1}(V_{gs} - V_{t2}) \cdot s \quad \text{Eq. (12)}$$

Thus, the width of the first transistor 12 may be scaled up, while its channel length is scaled down. That is, according to one embodiment of the transistor circuit implementation method taught herein, the channel lengths and widths are changed between the paralleled transistors 12 and 14, to keep $g_m$ and the area constant.

For a given implementation, the gate bias that yields the same transconductance and flicker noise for the transistors 12 and 14 can be calculated as follows $$I_{DS1} = \frac{\mu C_{ox} W_1}{2L_1}(V_{gs} - V_{t1})^2 \quad \text{Eq. (13)}$$

$$I_{DS2} = \frac{\mu C_{ox} W_2}{2L_2}(V_{gs} - V_{t2})^2 \quad \text{Eq. (14)}$$

$$g_{m1} = \frac{\mu C_{ox} W_1}{L_1}(V_{gs} - V_{t1}) \quad \text{Eq. (15)}$$

$$g_{m2} = \frac{\mu C_{ox} W_2}{L_2}(V_{gs} - V_{t2}) \quad \text{Eq. (16)}$$

Assuming that $g_{m1}=g_{m2}$ results in $$\frac{W_1}{L_1}(V_{gs} - V_{t1}) = \frac{W_2}{L_2}(V_{gs} - V_{t2}) \quad \text{Eq. (17)}$$

$$V_{gs} - V_{t1} = \frac{W_2 L_1}{W_1 L_2}(V_{gs} - V_{t2}) \quad \text{Eq. (18)}$$

With that, and with the same area $A=W_1L_1=W_2L_2$, and $$V_{gs} - V_{t1} = \left(\frac{L_1}{L_2}\right)^2 (V_{gs} - V_{t2}) \quad \text{Eq. (19)}$$

$$V_{gs} = \frac{L_2^2 V_{t1} - L_1^2 V_{t2}}{L_2^2 - L_1^2} \quad \text{Eq. (20)}$$

Thus, Eq. (20) represents the gate bias solution that operationally yields the same transconductance and flicker noise for the transistors 12 and 14.

For further tailoring of the transistor circuit 10 for use as an RF building block, it should be noted that radio circuit designers sometimes are concerned with the parameter $g_m/g_{ds}$, which may be considered as a measure of amplification, where $g_{ds}$ represents drain-source conductance. This parameter is affected by dopant concentration redistributions in the transistor channels, arising from interstitials being created in the source/drain regions because of mechanical stress. According to well-understood CMOS design theory, $g_{ds}$ depends on the channel length modulation in the pinched off region of operation. Thus, a high doping in the channels of transistors 12 and 14 results in a lower drain-source conductance, which can be beneficial in RF applications.

Of course, the present invention is not limited by the foregoing discussion, nor is it limited by the accompanying drawings. Indeed, the present invention is limited only by the following claims, and their legal equivalents.

What is claimed is:

1. A transistor circuit comprising:
   parallel first and second transistors having substantially the same threshold voltage curve as a function of transistor channel length;
   said first transistor configured with a first transistor channel length matched to a threshold voltage peak in the threshold voltage curve arising from reverse short channel effects; and
   said second transistor configured with a second transistor channel length greater than the first channel length, such that a threshold voltage of the second transistor is lower than a threshold voltage of the first transistor, thereby improving a linearity of the transistor circuit over a given range of operating conditions.

2. The transistor circuit of claim 1, wherein the second transistor channel length is configured to be at least about twice the first transistor channel length.

3. The transistor circuit of claim 1, wherein the transistor circuit is implemented in a Metal Oxide Semiconductor (MOS) process, and wherein the first transistor channel length is at or about 0.1 μm and the second transistor channel length is greater than 0.1 μm.

4. The transistor circuit of claim 1, wherein the first and second transistor channel lengths are configured such that a difference in threshold voltages between the first transistor and the second transistor reduce non-linearity in the transistor circuit's transconductance.

5. The transistor circuit of claim 1, wherein the second transistor channel length is set to a length that results in a difference in threshold voltages of the first and second transistors that balances an on-state current contribution of the first and second transistors.

6. The transistor circuit of claim 1, wherein a width of the first transistor channel is configured such that an area of the first transistor channel substantially matches an area of the second transistor channel.

7. The transistor circuit of claim 1, wherein the first transistor comprises two or more integrated circuit transistor elements configured with the first transistor channel length, and the second transistor comprises two or more integrated circuit transistor elements configured with the second transistor channel length.

8. The transistor circuit of claim 1, wherein the transistor circuit comprises part of a radiofrequency mixer circuit.

9. The transistor circuit of claim 1, wherein the transistor circuit comprises part of a radiofrequency low-noise amplifier circuit.

10. The transistor circuit of claim 1, wherein the transistor circuit comprises part of a radiofrequency power amplifier circuit.

11. A method of implementing a transistor circuit comprising:
    coupling in parallel first and second transistors having substantially the same threshold voltage curve as a function of transistor channel length;
    configuring the first transistor to have a first transistor channel length matched to a threshold voltage peak in the threshold voltage curve arising from reverse short channel effects; and
    configuring the second transistor to have a second transistor channel length greater than the first transistor channel length, such that a threshold voltage of the second transistor is lower than a threshold voltage of the first transistor, thereby improving a linearity of the transistor circuit over a given range of operating conditions.

12. The method of claim 11, wherein configuring the second transistor to have a second transistor channel length greater than the first channel length comprises configuring the second transistor channel length to be at least about twice the first transistor channel length.

13. The method of claim 11, wherein the transistor circuit is implemented in a Metal Oxide Semiconductor (MOS) process, and wherein configuring the first transistor comprises configuring the first transistor channel length to be at or about 0.1 μm, and wherein configuring the second transistor comprises configuring the second transistor channel length to be greater than 0.1 μm.

14. The method of claim 11, further comprising configuring the first and second transistor channel lengths such that a difference in threshold voltages between the first transistor and the second transistor reduces non-linearity in the transistor circuit's transconductance.

15. The method of claim 11, further comprising configuring the first and second transistor channel lengths such that a difference in threshold voltages of the first and second transistors is operative to balance on-state current contributions of the first and second transistors.

16. The method of claim 11, wherein the first transistor comprises two or more integrated circuit transistor elements configured with the first transistor channel length, and the second transistor comprises two or more integrated circuit transistor elements configured with the second transistor channel length.

17. The method of claim 11, further comprising biasing the transistor circuit at a gate bias value resulting in substantially the same transconductance and flicker noise values for the first and second transistors.

18. The method of claim 17, further comprising calculating the gate bias value as a function of the first and second transistor channel lengths and the threshold voltages of the first and second transistors.

19. The method of claim 11, further implementing the first and second transistors in a semiconductor process that exhibits a broad voltage threshold peak, thereby reducing a voltage threshold sensitivity of the first transistor to manufacturing variations in the first transistor channel length.

20. The method of claim 11, further comprising configuring the first and second transistor channels to have substantially the same channel areas.

* * * * *

UNITED STATES PATENT AND TRADEMARK OFFICE
CERTIFICATE OF CORRECTION

PATENT NO. : 7,652,519 B2  Page 1 of 1
APPLICATION NO. : 11/449460
DATED : January 26, 2010
INVENTOR(S) : Torkel Arnborg It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 287 days.

Signed and Sealed this

Twenty-third Day of November, 2010

David J. Kappos
*Director of the United States Patent and Trademark Office*